United States Patent

Kaveh

[19]

[11] Patent Number: 5,905,850
[45] Date of Patent: May 18, 1999

[54] METHOD AND APPARATUS FOR POSITIONING SUBSTRATES

[75] Inventor: Farrokh Kaveh, Palo Alto, Calif.

[73] Assignee: LAM Research Corporation, Fremont, Calif.

[21] Appl. No.: 08/671,715

[22] Filed: Jun. 28, 1996

[51] Int. Cl.$^6$ .............................. B65G 47/24; B23P 19/00
[52] U.S. Cl. .......................... 395/94; 414/217; 414/783; 198/394
[58] Field of Search .............................. 395/94; 318/568; 414/217, 783, 936–939; 198/394

[56] References Cited

U.S. PATENT DOCUMENTS

| | | | |
|---|---|---|---|
| 4,685,206 | 8/1987 | Kobayashi et al. | 29/740 |
| 4,707,647 | 11/1987 | Coldren et al. | 318/568 |
| 4,752,898 | 6/1988 | Koenig | 364/559 |
| 4,917,556 | 4/1990 | Stark et al. | 414/217 |
| 5,238,354 | 8/1993 | Volovich | 414/779 |
| 5,511,934 | 4/1996 | Bacchi et al. | 414/783 |
| 5,513,948 | 5/1996 | Bacchi et al. | 414/783 |

*Primary Examiner*—Allen R. MacDonald
*Assistant Examiner*—Hani M. Kazimi

[57] ABSTRACT

A method and apparatus for positioning substrates is provided. The substrates are typically semiconductor wafers that require centering on a mounting location within a process module and orientation of a notch, flat or perimeter interruption to a known rotational position. A robot arm transfers wafers from a source to the process module. A camera is provided adjacent a path of travel of the robot arm to scan the wafers as they pass thereover. A grayscale analysis determines the centroid, or other reference point, of the wafer and the location of the notch or flat. The path of travel of the arm is altered to account for misalignment of the centroid/reference point from a known location. Data related to the rotational offset of the notch or flat relative to a known standard location is also obtained. The wafer can be rotated to position the notch or flat at a desired standard position using a rotator mounted on the robot arm or at a remote site.

16 Claims, 6 Drawing Sheets

METHOD AND APPARATUS FOR POSITIONING SUBSTRATES

FIELD OF THE INVENTION

This invention relates to a method and apparatus for aligning and rotationally orienting substrates and more particularly to a semiconductor wafer processing system with improved wafer handling characteristics.

BACKGROUND OF THE INVENTION

The production of etched semiconductor wafers for use in microcircuit chips typically employs large process module systems. Semiconductor process modules form part of a large grouping of components that are usually located in a clean room environment. A clean room is an isolated environment in which the introduction of dust and other foreign matter is strictly controlled. Only by maintaining such control can a high quality semiconductor product be produced. The high level of environmental control makes clean room space extremely expensive. Since the majority of semiconductor processing equipment must be located within the floor space of the clean room, the size of that equipment becomes a significant cost consideration.

Figure 1:
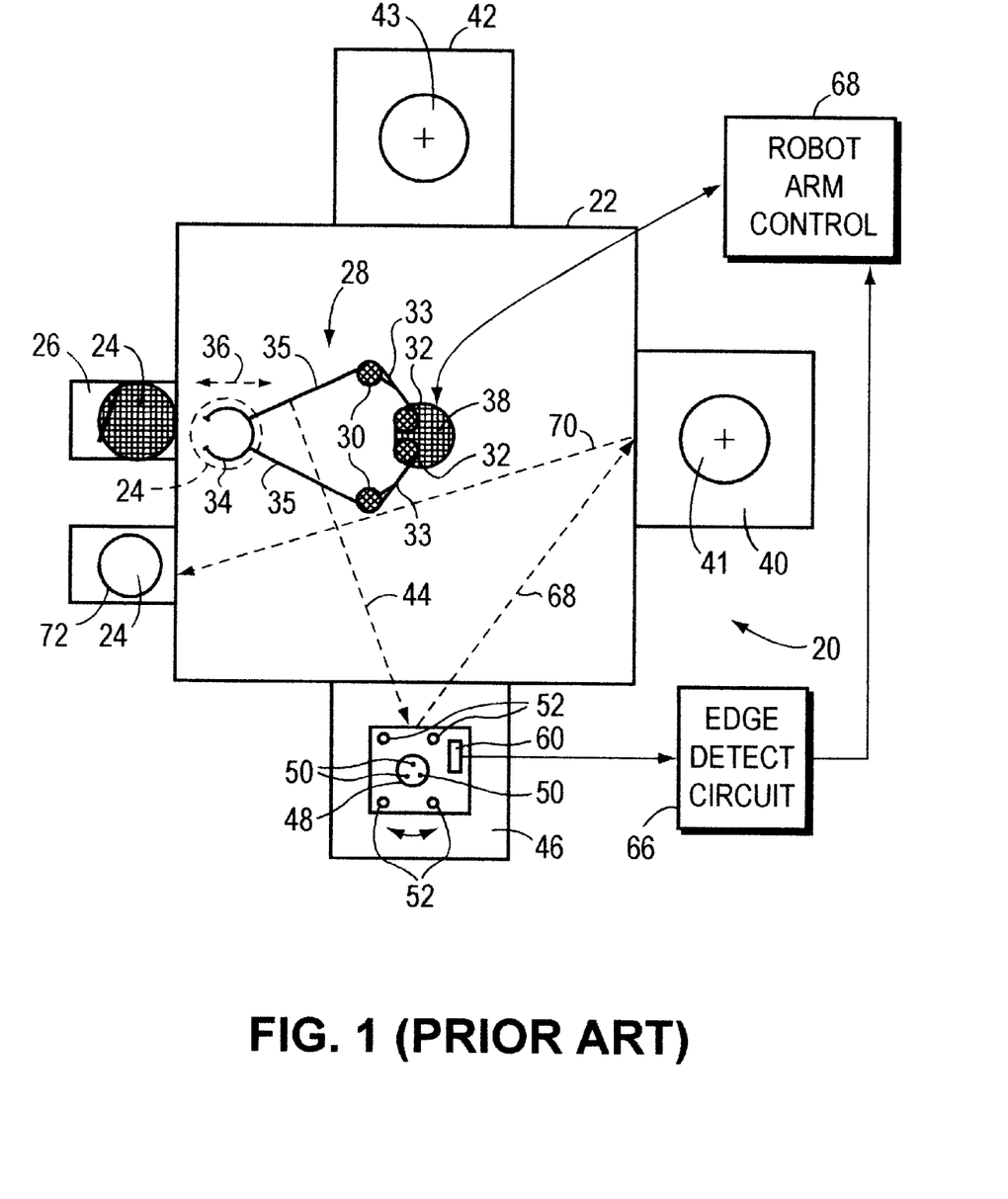
FIG. 1, already described, is a schematic plan view of a cluster tool for processing substrates, including an alignment module according to the prior art.

A conventional semiconductor wafer processing facility, according to the prior art, is detailed in FIG. 1. The facility in this example is a cluster tool 20. A variety of arrangements and organizations of facilities are in use. In particular, the cluster tool includes a central transport or handling module or platform 22 that is surrounded by modules that perform operations on the wafers. In this example, unprocessed wafers 24 are stored in a vacuum cassette elevator 26 that moves a stack of wafers upwardly to provide new wafers as needed. A robot arm 28 having articulating joints 30 and 32 connecting arm segments 33 and 35 is used to handle wafers 24 within the facility 20. An end effector 34 engages each wafer 24 and withdraws it (double arrow 36) from the vacuum cassette elevator 26 as needed. The arm 28 moves about its pivoting base 38 to access each of the facility modules according to a preprogrammed sequence or "recipe."

Wafers 24 are processed to include etched or deposited surfaces by process modules that perform specific tasks. A typical cluster tool can include two to four process modules. Wafers are often shuttled between one process module and another to undergo multiple process steps. Prior to entry of a wafer, into a process module it is common practice to align and orient the wafer into a standard position. Most wafers are circular in perimeter outline, but each may include a notch, flat or other "interruption" at an arbitrary location along its perimeter. This notch or flat serves to provide a standard rotational reference point for further processing.

When wafers 24 are stacked in the cassette 26, they are not generally oriented so that all notches or flats are similarly positioned. In addition, wafers are not always accurately centered on the end effector 34 following retrieval from the cassette 26. Hence, without performing prior alignment, each wafer may enter a particular process module with its own unique rotational orientation and centering. Proper processing generally necessitates that wafers be centered in the various process modules. Thus they must be centered relative to the end effectors that place wafers into the modules. Rotational orientation should also remain constant, particularly during the photolithography step of the process so that patterns are stacked over one another in the proper relationship. It is also desirable to maintain a known rotational orientation when wafers are periodically inspected for non-uniformities. An inspection usually entails a survey of the processed surface with respect to the notch or flat. If some portion of the processed surface includes a non-uniformity or defect, then this may suggest that a particular process module should be serviced. Accordingly, the position of the notch or flat relative to the mounting location 41 and 43 of the respective process module 40 and 42 must be known to derive the source of the non-uniformity. Hence, prior to insertion of wafers 24 into process modules 40 and 42, the wafers are fed (arrow 44) to an alignment module 46 that places each wafer in a properly centered and rotated position with respect to the robot arm.

Figure 2:
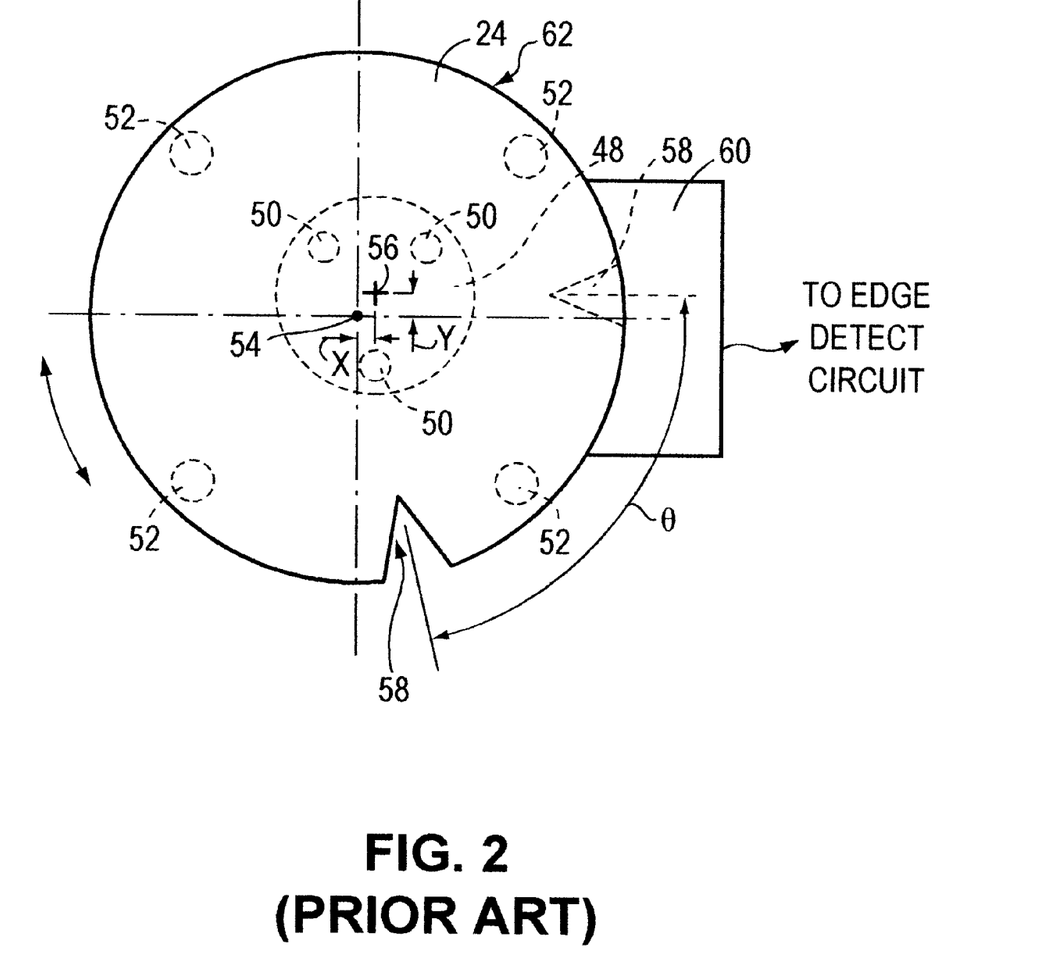
FIG. 2, already described, is a more-detailed schematic plan view of a wafer located on the spinner of the alignment module of FIG. 1.

During the alignment step, the end effector 34 lays each wafer atop a spinner or capstan 48 having a series of vacuum ports 50, or other friction-generating devices that retain the wafer on the spinner 48. A lifter having four pins 52 can be employed to carefully lower the wafer onto the spinner once the end effector is located over it. FIG. 2 illustrates the positioning of a typical wafer 24, in an unaligned state, on the spinner 48. The wafer's center 54 is offset from the desired center 56. Likewise, the notch 58 is offset from the desired rotational positioning of the notch (shown in phantom). This rotational offset is represented by an angle θ. The spinner 48 rotates the wafer 24 as an edge detector 60 scans the perimeter 62 of the wafer. Changes in position of the detected perimeter edge during rotation are used to derive the eccentricity of the wafer center 54 relative to the spinner center 56. An edge detect circuit 66 calculate the degree of eccentricity based upon the detected changes.

Based upon signals from a robot arm controller 68, the wafer is periodically lifted by the robot arm 28 to reposition the wafer so that its center 54 is aligned with the spinner center 56. Once the wafer is ally centered, the edge detector 60 is then focused upon the notch 58. The wafer is spun until the notch is found. The spinner 48 rotates the wafer so that the notch is positioned at a desired rotation orientation. Following the centering and orienting procedure, the wafer is lifted from the spinner 48 using, for example, the pins 52 and reengaged by the arm end effector 34. The end effector then transports the wafer (arrow 68) to the process module 40. At this time, the end effector enters the module and places the wafer at a precise, preprogrammed location for semiconductor processing. Following processing, the wafer is typically moved by the arm (arrow 70) to a receive indexer 72. The wafer may be realigned in the alignment module each time a further process is performed. Thus, if the wafer is subsequently moved to the second process module 42, it may, first, make a return trip to the alignment module 46.

In some facilities, process modules include elaborate entrance and exit load locks (ELL's and XLL's) each having individual arms with individual alignment units. Clearly, a great deal of space is occupied by the need for dedicated alignment modules and mechanisms. As noted above, this waste of precious clean room floor space to provide alignment devices adds substantial costs to the process.

It is, therefore, an object of this invention to provide a method and apparatus for aligning and rotationally orienting substrates, such as semiconductor wafers, that omit complex alignment modules and mechanisms. This method and the related apparatus should increase the overall process speed for manufacturing wafers, but should still provide desired information on the precise orientation and alignment of individual wafers. The method and apparatus should also provide improved tracking of wafers as they move through a processing facility.

SUMMARY OF THE INVENTION

This invention provides a method and apparatus for aligning/centering and rotationally orienting substrates, particularly for use in semiconductor wafer processing facilities, that overcome the disadvantages of the prior art. A camera, interconnected with a grayscale processing unit scans each wafer to locate its relative position and its associated perimeter notch or flat. This data is used to effect alignment and rotational orientation of the wafer as it enters selected process modules in the facility. As a result, a separate alignment module can be omitted, and rather than centering each wafer on the facility's manipulator arm, the arm is reoriented based upon the actual position of the wafer on the arm. As such, the arm proceeds to a process module along a modified path of travel.

According to one embodiment, an apparatus for positioning substrates provides a source of substrates and a manipulator having an end effector for engaging the substrates at the source. The end effector can be part of an arm that moves the substrates to locations remote from the source. One of the locations can be a process module that processes substrates. Such a process can include semiconductor etching or deposition. The process module has at least one mounting location for mounting substrates thereon. A camera is provided. The camera generates an image of a substrate when the substrate is located on the end effector and while the end effector is positioned adjacent the camera. By "adjacent," it is meant under, over, or otherwise located in o position in which the camera can view the wafer. A sensing processor is operatively interconnected to the camera. The sensing processor determines the position of the centroid or another reference point of the substrate and compares the position of the reference point with a known position of the mounting location. The end effector position relative to the mounting location is also known, and the robot arm travels along a known path to the mounting location. Thus, the end effector can be adjusted to account for variations in the centering of the wafer. And these adjustments affect the final positioning of the end effector when it reaches the mounting location. A manipulator control processor, that is operatively interconnected with the sensing processor moves the end effector while compensating for a difference between the known position and the centroid (or other reference point) of the substrate so that when the end effector is moved automatically to the mounting location in the process module, the wafer's centroid is placed over the mounting location's center.

The apparatus can further include a perimeter interruption locator that scans for a notch, flat or other interruption along the perimeter of the substrate. The locator compares a sensed perimeter interruption to a known angular location and uses this data to derive an offset angle θ. A memory can be provided to store the angle θ for future use. The angle θ can also be employed to physically rotate the substrate using a rotator mounted on either the end effector or at a remote, freestanding location. The manipulator can be a robot arm that is located in a cluster tool handling module. The arm can also be located in an entrance load lock, that services as a process module.

According to another embodiment, a method for positioning substrates is provided. Substrates are retrieved from a source of substrates. An end effector of a manipulator engages the substrates. The end effector is located adjacent to a camera unit. An outline shape of the substrate is retrieved as an image. Using the image, a centroid or other reference point of the substrate is determined and the position of the reference point relative to a known location is also determined. The difference between the position of the wafer's reference point and the known location is calculated and stored as an adjustment factor. The end effector is, thus, moved to a remote location along a predetermined path that is changed to account for the adjustment factor.

BRIEF DESCRIPTION OF THE DRAWINGS

The foregoing and other objects and advantages of the invention will become more clear with reference to the following detailed description as illustrated by the drawings in which.

DETAILED DESCRIPTION

Figure 3:
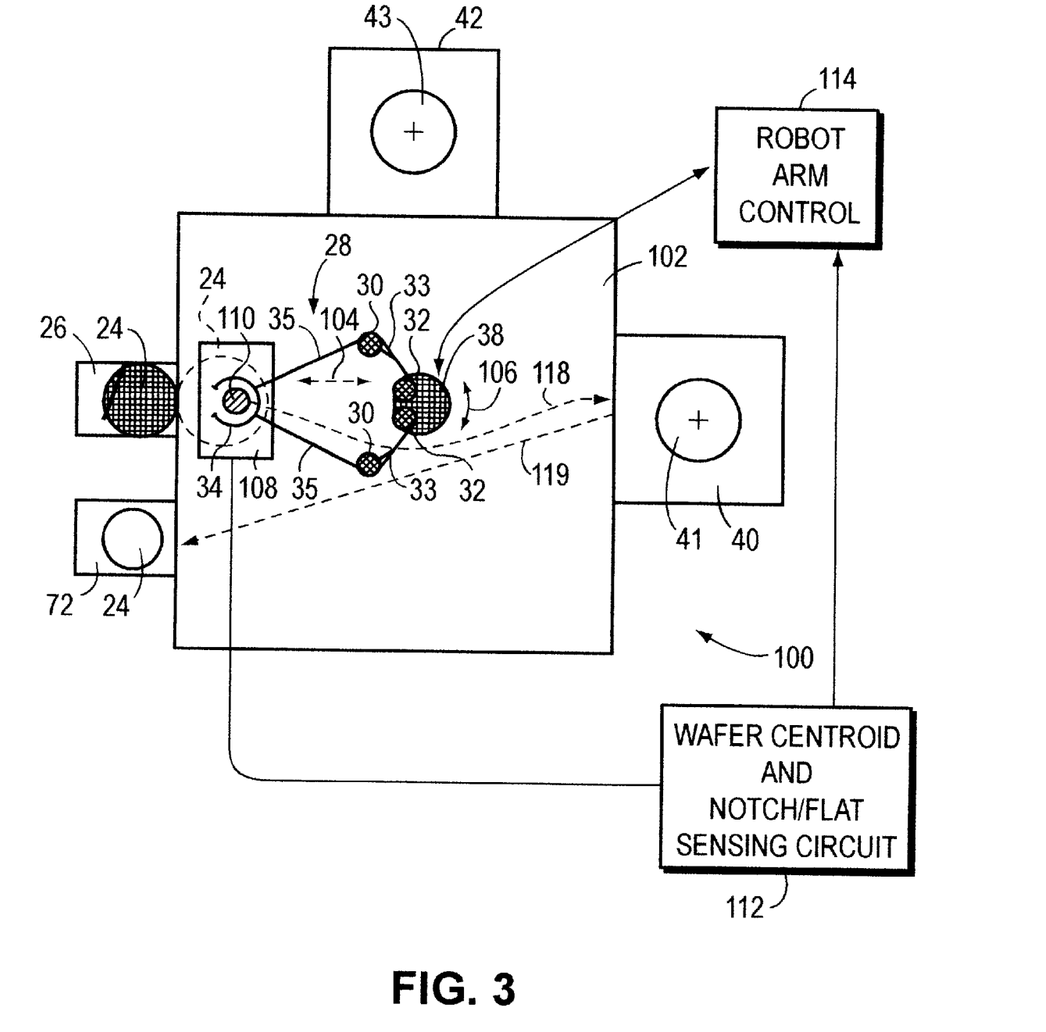
FIG. 3 is a schematic plan view of a semiconductor wafer processing facility, including a mechanism for aligning and rotationally orienting wafers according to one embodiment of this invention.

FIG. 3 illustrates a semiconductor processing facility according to an embodiment of this invention. The processing facility is organized as a cluster tool 100 with a central wafer handling module 102 surrounded by a series of process modules. Elements that are like those described for the prior art cluster tool 20 of FIG. 1 are given like reference numbers. In particular, a pair of process modules 40 and 42 are located on adjacent sides of the handling module 102. Additionally, a centrally located robot arm 28 is provided. The robot arm, like that of FIG. 1, uses a pantograph-style arm arrangement with a pair of driving joints 32 for swinging arm segments 33 and 35. The arm segments are, themselves, joined by articulating joints 30. The arm 28 is mounted on a swiveling base 38. The powered joints 32 enable the end effector 34 to move forwardly and rearwardly (double arrow 104). The base 38, similarly, rotates (curved arrow 106) to move the end effector about the module 102. In this embodiment, the end effector 34 can be made movable upwardly and downwardly (perpendicularly to the plane of the page) by providing an elevator drive (not shown) to the swiveling base 38 or a similar lifting mechanism acting upon the arm 28 or the end effector 34.

According to this embodiment, a camera unit 108 having a camera lens 110 is located adjacent the vacuum cassette elevator 26. The exact location of the camera unit 108 can be varied depending upon the configuration of the facility. It is desirable that it be located in an area that is along the natural path of travel of the arm or adjacent thereto, to minimize extraneous movements of the robot arm 28 from a direct path of travel between modules. In this embodiment, the camera is mounted on the surface of the handling module 102 so that wafers pass "over" the camera to be scanned. It is contemplated that the camera can be mounted over the module 102 or at a remote point so long as the camera can view the wafer at some point along its path of travel. While the term passing "over" is used to describe the scanning of the wafer, that term should be taken to include scanning of the wafer by the camera at any relative positioning, including "over," "under," "aside" or "adjacent."

The camera unit 108 comprises a conventional solid-state CCD, or equivalent video camera, having an objective view point or lens size sufficient to scan the entire surface of a wafer 24 at once. Alternatively, the camera can be located so that it scans only part of the wafer, but derives an image of the entire wafer as it passes thereover. However, in a moving scan application, additional scanning software (described generally below) is required.

The camera unit 108 is interconnected with a wafer centroid and notch/flat sensing circuit 112. The operation of this circuit is also described further below. In summary, it is a commercially available image processor circuit or software package that uses a conventional grayscale analysis of the viewed wafer passing over the camera unit 108. The sensing circuit 112 determines the center or "centroid" of the wafer and the orientation of the notch or flat on the wafer perimeter using known centroid calculation methods. Again, while the wafer centroid is located according to this embodiment, it is expressly contemplated that the sensing circuitry can identify any reference point or group of points (such as the perimeter or a portion of the perimeter) on the wafer to determine its relative position. For example the sensing circuit or routine can scan for an arc of the wafer perimeter and store date representing a relative location of the arc. Thus while "centroid" is used herein, it shall be taken broadly to include any reference point or points on the wafer from which a position of the wafer can be discerned.

The sensing circuitry 112 is interconnected with the robot arm control circuit 114 which has been modified to interpret data from the sensing circuit 112. The robot arm control 114, which can be integrated into the handling module 102, is operatively connected with the robot arm 28 so that the control 114 directs movement of the robot arm 28 about the module 102.

Figure 6:
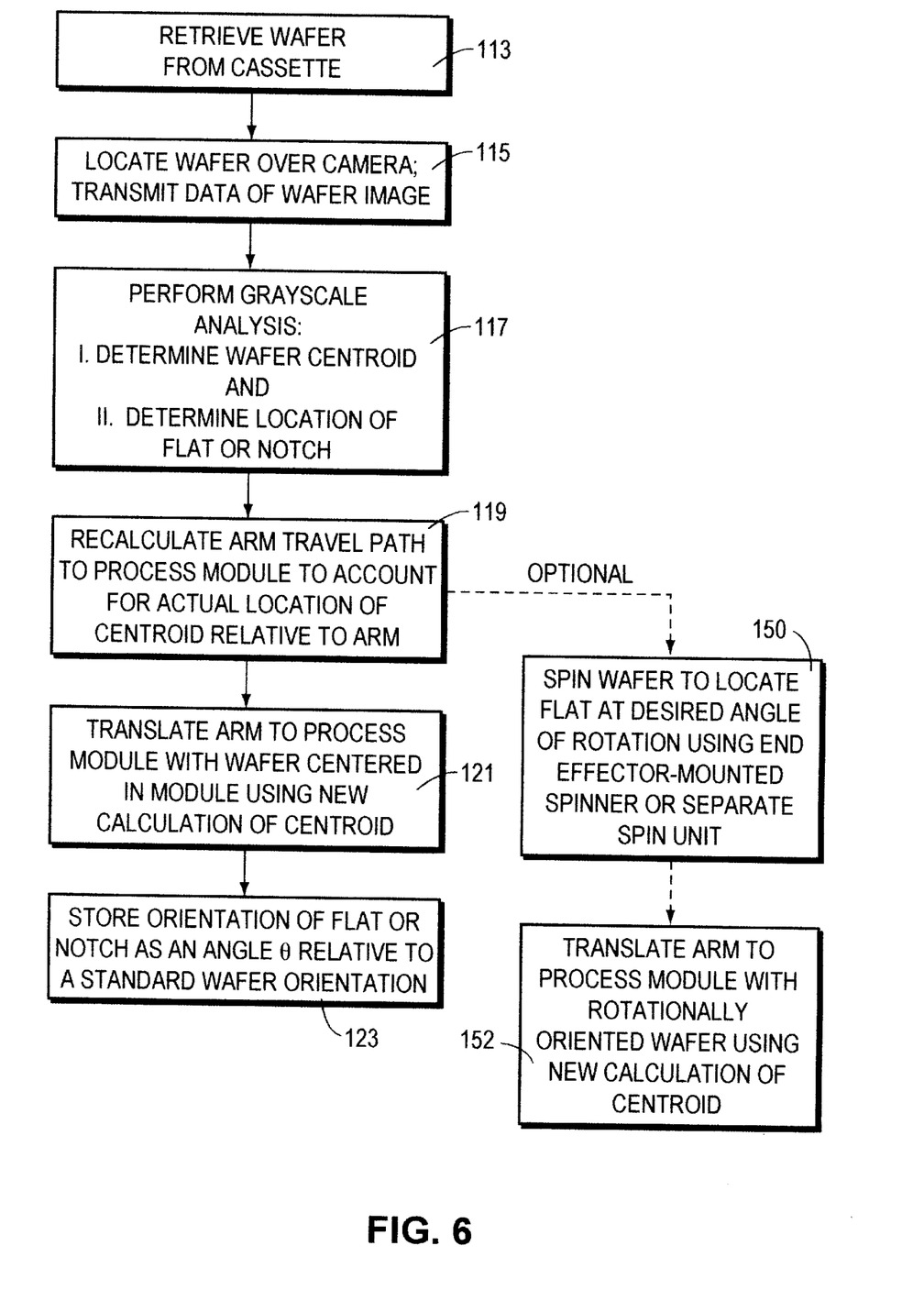
FIG. 6 is a flow diagram of a process for aligning and rotationally orientating substrates according to this invention.

Reference may now also be made to the flow diagram of FIG. 6 which sets forth the alignment sequence for a wafer according to this embodiment. In this embodiment, the robot arm 28 is programmed to move so that the end effector withdraws a wafer 24 from the cassette (block 113) and passes over the camera unit 108 (block 115) as it moves (arrow 118) to the process module 40. The camera unit 108 scans the wafer 24 as it rests on the end effector 34. To ensure proper scanning, the arm 28 can slow down or stop briefly while the end effector is adjacent the camera unit 108. Conversely, a quick-scanning camera can vitiate the need for delay as the wafer passes over the camera unit 108. The profile of the wafer 24 is scanned by the camera unit and the data of the visual image is digitized by conventional processes and transmitted as a data stream to the wafer centroid and notch/flat sensing circuit 112. This sensing circuit 112 can be implemented in hardware, or part of a software processor routine. It can be part of the existing handling module 102 arm controller or can be an added component. The sensing circuit 112 performs a grayscale analysis of the viewed image (block 117).

According to this embodiment, the grayscale analysis is performed when the robot arm end effector 34 has reached a predetermined known location relative to the camera unit 108. The triggering of the camera unit 108 and sensing circuit 112 can be linked to the robot arm control circuit 114 which tracks the position of the end effector 34 as it moves along its path. When a location corresponding to the location of the camera unit is identified, the camera unit 108 and sensing circuit 112 are triggered. In performing the resulting grayscale analysis, the sensing circuit 112 differentiates between darkened areas, representing the space occupied by the wafer 24 and lighter areas, representing the space occupied by the area outside the perimeter of the wafer 24. In some embodiments, an appropriate light-colored background can be provided above the camera to generate a contrast difference. The perimeter outline of the wafer, including the notch or flat, are translated into a series of coordinate values and the coordinate values are compared to the desired location of a wafer 24 when the end effector 34 is located at the predetermined known location relative to the camera unit 108. The calculation can include a derivation of the scanned wafer's centroid (or other reference point) relative to the desired center point. Calculating the difference between the actual scanned wafer centroid and the desired center point, an X and Y-component transformation is obtained (block 119). This value is stored. The sensing circuit 112 also determines the location of the flat or notch of the wafer by identifying a discontinuity in the perimeter. It is contemplated that most perimeters of wafers are circular, but other shapes having relatively regular outlines are also contemplated. The rotational position of the discontinuity relative to the camera unit 108 is determined. This value is stored as an angle θ (block 123). Note that each wafer in a set to be processed can be numbered or identified and that the data relative to the X and Y-transformation and angle θ can be permanently stored relative to that wafer's identifier.

As further detailed in FIG. 3, subsequent to scanning, the wafer is moved along the path (arrow 118) to the process module 40. The robot arm 28 adjusts its movement path to account for the X and Y-transformation so that the wafer is placed within the process module with a correction factor that leaves it accurately centered at the mounting location 41 within the process module (block 121).

No further scanning of the wafer at the process module is required, all variation in wafer centroid positioning has been accounted-for with the transformation, and the end effector travels to a known location in the process module subject to the correction factor. In the basic embodiment described above, the rotational orientation of the wafer 24 is not changed. The angle θ, rather, is stored and used later as a correction factor (block 123). In such an embodiment, the angle θ is used as a reference for determining the actual rotational orientation of the processed surface relative to the notch or flat. As noted above, inspection of wafers generally occurs only periodically (once every 12 or 24 hours) to ensure that the process unit is performing as expected. Subsequent to processing, the wafer can be transferred to another process module, such as adjacent process module 42 or, as shown, can be transferred back to the receive cassette 72 (see arrow 119). If further processing is undertaken, the robot arm 28 can pass back over the camera unit 108 to ensure that alignment is maintained. Alternatively, additional camera units (not shown) interconnected with the sensing circuit 112 can be provided at other strategic positions on the handling module 102.

Figure 4:
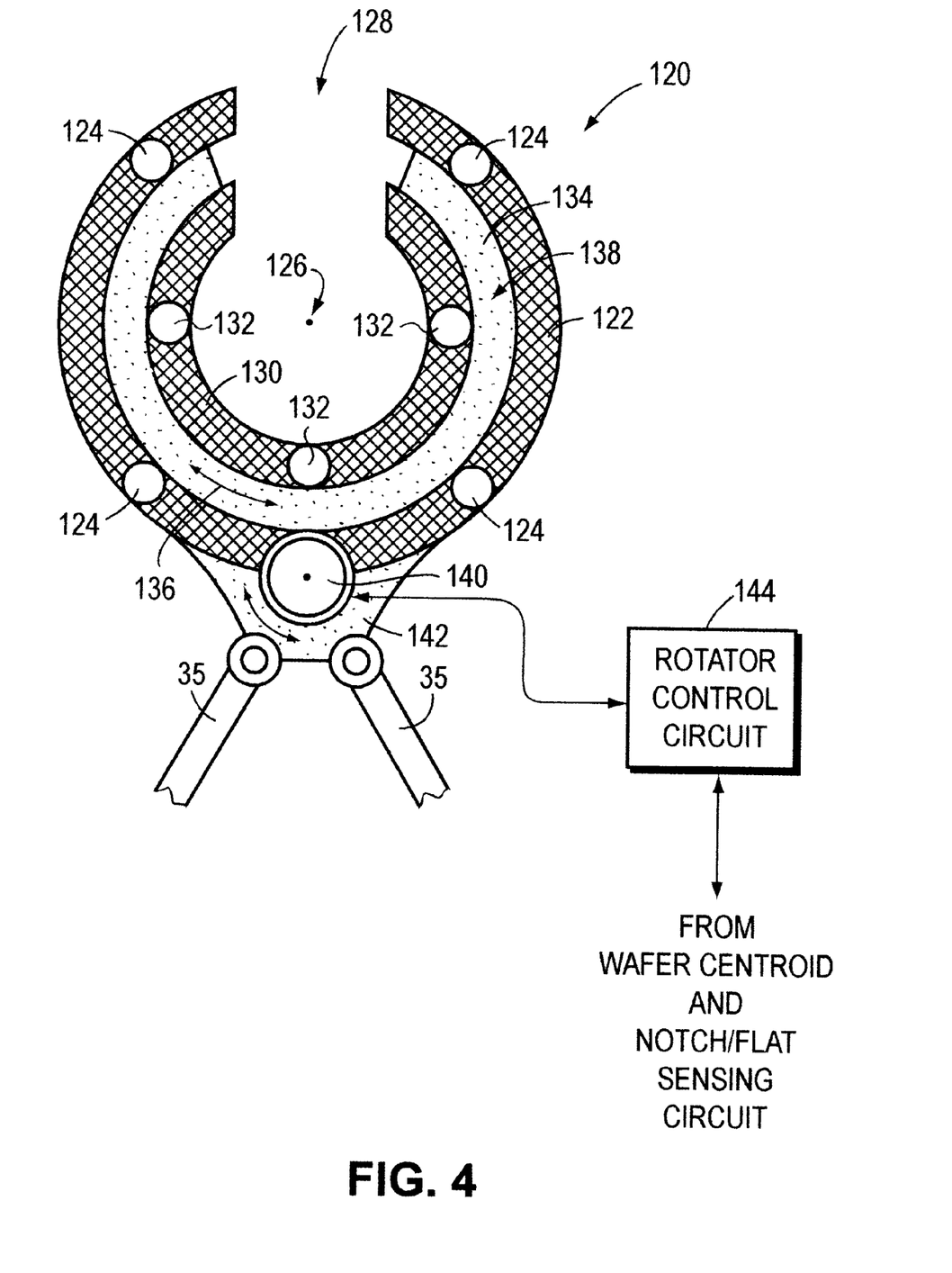
FIG. 4 is a schematic plan view of an end effector having a spinner according to an alternate embodiment of this invention.

In some processes, it is desirable to provide a positive rotational orientation to wafers as they are moved between steps. FIG. 4 details an end effector 120 that can be used in conjunction with the robot arm 28 shown and described in FIG. 3. In this embodiment, the end effector 120 includes an outer frame 122 having support bearings 124. The outer frame 122 is formed as a C-shape with an open center 126 and a channel 128. This enables the end effector to pass over a spinner, capstan or other freestanding support. An inner frame 130 with inner support bearings 132 is also provided in this embodiment. The inner and outer frames can be connected by appropriate underlying braces (not shown) to maintain a constant coaxial relationship. Between the inner and outer frames 122 and 130, respectively, is positioned a circular base member 134 that rotates (curved arrow 136) relative to the inner and outer frames 122 and 130. The base 134 can include a frictional surface 138 or ports interconnected with a vacuum source (not shown) to maintain the wafer in non-slidable contact with the base 134. The base 134 can be formed with a raised surface so that the frames 122 and 130 do not drag upon a wafer surface when the wafer rests upon the end effector 120. The base 134 rotates in response to a motor 140. The motor 140 is mounted upon the base support bracket 142 according to this embodiment. However, the motor 140 can be mounted anywhere along the end effector or remote from the end effector. When mounted remote from the end effector, the motor is interconnected with the base by appropriate drive shafts and power transmission components of conventional design (not shown).

The motor 140 can comprise a stepper motor or servo that enables the rotational position of the base 134 relative to the frames 122 and 130 to be ascertained at any time and accurately manipulated. The motor 140 is interconnected with a rotator control circuit 144 that can be implemented as a hardware control circuit or, alternative as a software routine. The rotator control circuit 144 is, itself, interconnected with the wafer centroid and notch/flat sensing circuit 112 described with reference to FIG. 3. Data related to the rotational angle θ is transmitted to the rotator control, which rotates the base 134, via the motor 140. The translation of the base is directed in a clockwise or counter-clockwise direction for an angular distance equal to θ. The value θ can be supplied to the system as a positive or negative value to instruct the motor to move in either a clockwise or counter-clockwise direction, respectively.

Referring again to FIG. 6, the rotation of the wafer by the end effector 120 is illustrated as an optional step block 150). The rotation can occur prior to arm translation, while the wafer is still adjacent the camera unit 108. The camera unit 108 can be instructed to rescan the wafer to ensure proper rotation. Subsequent to rotation the wafer is translated (block 152) to the designated process module where it is properly aligned within the module using the X-Y transformation values determined by the wafer sensing circuit 112. Alternatively, the spin command can be transmitted to the end effector when the wafer is located adjacent the process module. A spin can occur at any time during the process so long as it occurs before the wafer is disengaged from the end effector 120. The spinner can also operate in conjunction with signals from the robot arm control circuit 114 to spin the wafer as it moves into other process modules so that it always enters a given process module in a predetermined rotational orientation.

Figure 5:
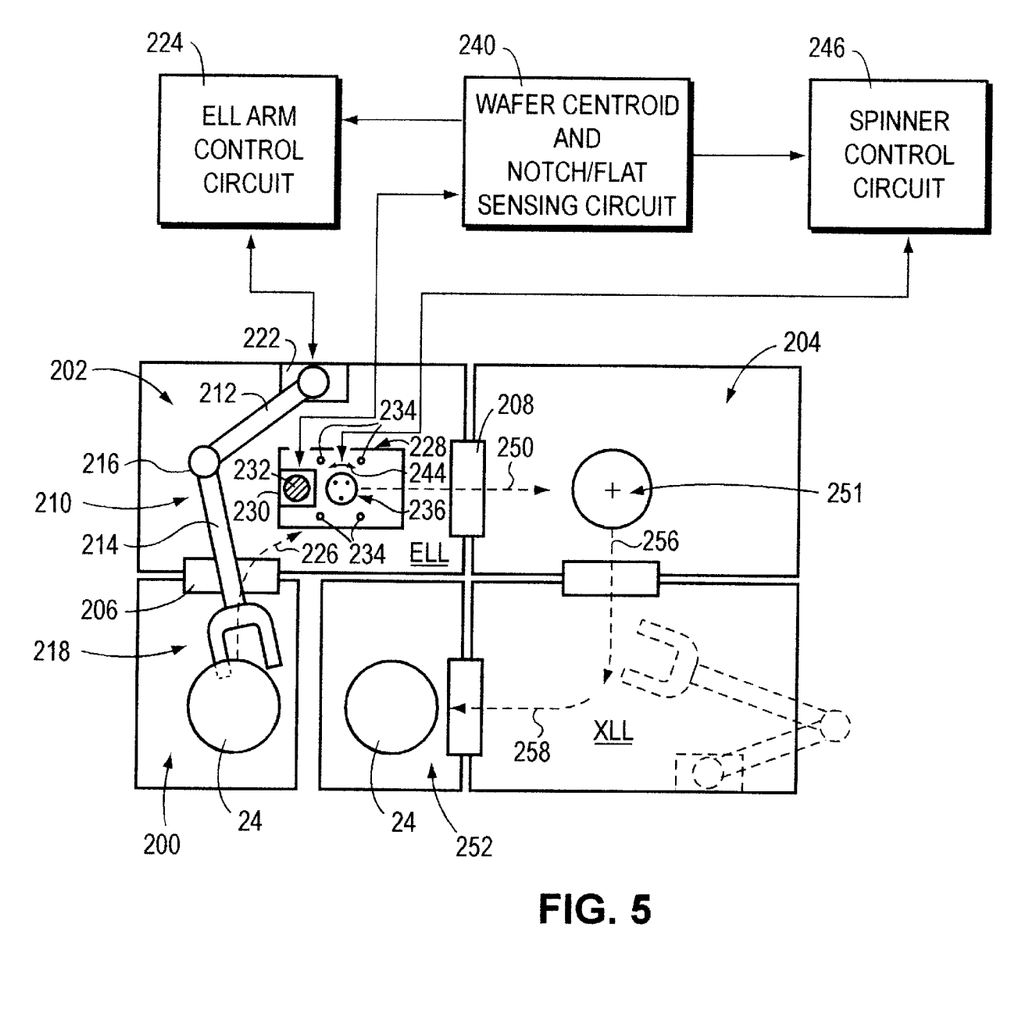
FIG. 5 is a schematic plan view of an entrance load lock (ELL) for use with a process module, having a mechanism for aligning and rotationally orienting wafers according to another alternate embodiment of this invention.

The aligning and rotational orienting process described according to this invention is not limited to facilities organized as cluster tools. FIG. 5 illustrates an alternate embodiment in which wafers 24 are retrieved from a send indexer 200 for placement in an entrance load lock 202 that services a process module 204. The entrance load lock (ELL) 202 includes automatically operated gates 206 and 208 that enable a vacuum to be formed at selective times within the entrance load lock prior to introduction of wafers 24 into the process module 204. An entrance load lock arm assembly 210 extends at selected times through the port 206 to retrieve wafers 24 from the send indexer 200. The arm 210 includes two arm segments 212 and 224 joined at an articulating shoulder 216. The end effector 218 that engages wafers 24 is fork-shaped according to this embodiment. A drive motor 220 controls the arm 210 to move it about the entrance load lock. Various conventional linkages (not shown) can be provided to move each of the two arm segments 212 and 214 in a coordinated manner. For the purposes of this description, it is assumed that the linkages are all operatively interconnected with the control base 222 of the arm 210. The control base 222 is, itself, interconnected with the entrance load lock control circuit 224. The control circuit 224 can be a hardware or software-based processor and can be interconnected with the overall facility control system. In this embodiment, wafers 24 are retrieved by the arm 210 and moved (arrow 226) adjacent an entrance load lock spinner unit 228. In this embodiment, a camera unit 230 is provided adjacent the spinner unit 228. The camera unit 230, including a camera lens 232, can be provided in any location over which the end effector 218 can pass. As described in preceding embodiments, the camera unit 230 can be constructed from a variety of conventional components and is positioned so that it views the disk fully when the disk is positioned adjacent thereto.

A four-pin lifter unit comprising four pins 234 is positioned around the capstan 236 on the spinner unit 228. The capstan 236 can include conventional vacuum holes for firmly engaging a wafer. In operation, wafers 24 are removed from the send indexer 200 and passed along the path 226 to the capstan 236. The camera unit 230 analyzes the centroid and notch location of the wafer 24 using the wafer centroid and notch/flat sensing circuit 240. The sensing circuit 240 operates in a manner similar to that described with reference to FIG. 3. In other words, a grayscale analysis is used to determine the location of the wafer centroid and notch or flat. The centroid data is translated into X and Y-values and transmitted to the arm control circuit 224. The arm is then moved to compensate for the difference in the centroid position from a desired location. In this embodiment, the four pins 234 then raise the wafer, giving clearance for the end effector 218 to move away from the wafer 24 and capstan 236. The pins 234 then lower the wafer 24 onto the capstan 236 in a centered alignment. The capstan 236 rotates (curved arrow 244) based upon commands from the spinner control circuit 246. The spinner control circuit 246 operates after receiving the value θ from the wafer centroid and notch/flat sensing circuit 240. The wafer is now aligned and properly oriented. The four pins 234 again lift the wafer, enabling the end effector 218 to pass thereunder. The end effector 218 locates itself at a predetermined position relative to the capstan 236 so that, when the pins 234 again lower the wafer onto the end effector, the wafer is accurately positioned and oriented relatively to the end effector 218. The end effector is then moved along the path (arrow 250) through the port 208 into the process module 204. The end effector 218 deposits the wafer within the process module at a known mounting location 251, corrected for centroid misalignment.

The simplified alignment structure of this embodiment allows the receive cassette 252 to be positioned aside the send cassette 200. The exit load lock (XLL) 254 is adapted to move wafers from the process module (arrow 256) and then, at a right angle into the receive cassette 252 (arrow 258). Prior art exit load locks typically discharge in a straight line from the process module to the receive cassette since a complicated shuttle arm and lifter/spinner arrangement is located in the space occupied by the send and receive cassettes 200, 252 of this embodiment. The prior art send cassette is located substantially further away from the entrance load lock that the cassette 200 of this embodiment. Hence, the omission of elaborate alignment mechanisms has enabled substantial compaction of the facility's footprint in the clean room.

It is contemplated that the four pins 234 can be omitted and that the end effector 218 can be constructed so that it raises and lowers the wafer onto the capstan 236 itself. Whenever the end effector is out of engagement with the wafer, it is free to move to a new orientation to account for misalignments of the wafer. It is also contemplated that the end effector of the ELL arm described herein can include an integral spinner, such as that shown and described with reference to FIG. 4. Hence, only a camera unit need be located within the entrance load lock 202. However, as shown and described in FIG. 5, a separate spinner can be incorporated into any of the embodiments described herein. Such a spinner can be instructed to rotate based upon data derived from the camera's grayscale analysis of the location of the notch or flat.

The foregoing has been a detailed description of preferred embodiments. Various modifications and additions can be made without departing from the spirit and scope of this invention. For example, while semiconductor wafers are used as substrates in the foregoing embodiments, any substrate having a known perimeter can be processed according to this invention. Additionally, a variety of process facility configurations can be adapted to utilize the aligning and orienting processes described herein. When desirable, several cameras can be utilized in a single facility and separate analyses for each camera can be made. Accordingly, this description is meant to be taken only by way of example and not to otherwise limit the scope of this invention.

What is claimed is:

1. A method for positioning substrates comprising the steps of:

providing a source of substrates having a generally circular perimeter with an interruption along the perimeter;

retrieving a substrate from the source of substrates including engaging the substrate with an end effector of a manipulator the end effector including a spinner for rotating the substrate when the substrate is in engagement with the end effector;

locating the end effector adjacent a camera unit with the substrate located in engagement with the end effector wherein the camera views the substrate as it is located on the end effector;

retrieving an image of a shape of the perimeter of the substrate with the camera including positioning the substrate with respect to the camera so that the camera acquires an image of substantially an entire area of the substrate;

determining, from the image of the entire area of the substrate, a reference point within the perimeter of the substrate and a position of the reference point relative to a known location of the end effector as the image is retrieved;

determining an angular value θ based upon an angular offset of the interruption from a known standard position;

calculating a movement adjustment factor, while the substrate is positioned on the end effector based upon a difference between the location of the reference point and the known location;

moving the end effector to a substrate processing location along a predetermined path of movement, the path being modified based upon the adjustment factor so that the substrate is placed in the processing location with the perimeter aligned in a desired alignment; and rotating the substrate by the angle θ so that the substrate is placed in the processing location in a desired rotational alignment while the substrate is located on the end effector by rotating the spinner with which the substrate is engaged.

2. The method as set forth in claim 1 for the comprising storing the value θ in conjunction with an identifier for the substrate.

3. The method as set forth in claim 1 wherein the step of determining includes acquiring an angular alignment notch on the perimeter of the substrate.

4. The method as set forth in claim 1 further comprising applying a semiconductor processing step to the substrate at the remote location.

5. The method as set forth in claim 1 wherein the step of determining includes performing a grayscale analysis of image data transmitted from the camera unit and resolving location values relative to a perimeter of the substrate.

6. The method as set forth in claim 1 wherein the reference point includes the centroid of substrate and the known location is located at the remote location and comprises a center of a substrate mounting location.

7. An apparatus for positioning substrates comprising:

a source of substrates each having a perimeter with an interruption along the perimeter;

a manipulator including an end effector that engages a substrate at the source of substrates and that moves the substrate on the end effector in a predetermined orientation to a substrate process module for processing substrates remote from the source;

wherein the process module includes a mounting location for mounting substrate thereon in a desired orientation;

a camera unit located along a path of movement of the end effector between the source and the process module, the camera having a field of view within the path so as to view the substrate as the substrate is engaged the end effector, and the camera being constructed and arranged to acquire an image of substantially the entire area of the substrate while the substrate is engaged by the end effector and to thereby;

a sensing processor operatively interconnected to the camera, the sensing processor being constructed and arranged to determine, based upon the image of substantially the entire area of the substrate, a reference point of the substrate and to establish a position of the end effector when the image is acquired, the sensing processor being further constructed and arranged to compare a location of the reference point with a known position of the end effector when the image is acquired and being further constructed and arranged to sense a rotational location of the interruption to derive an offset angle θ with respect to a desired rotational orientation of the interruption;

a manipulator control processor, operatively interconnected with the sensing processor, the manipulator control processor being constructed and arranged to move the end effector while the substrate is positioned thereon to compensate for a difference between the known position and the reference point so that the end effector places the substrate in the desired orientation at the mounting location of the process module; and a rotator mounted on the end effector and in engagement with the substrate while it is positioned on the end effector, the rotator being operatively connected with the sensing processor, the rotator being constructed and arranged to rotate the substrate by the offset angle θ to the desired rotational location as the end effector is moved to the mounting location so that the substrate is placed at the mounting location in the desired rotational orientation.

8. The apparatus as set forth in claim 7 further comprising a memory operatively interconnected with the locator for storing a value for θ.

9. The apparatus as set forth in claim 7 wherein the interruption comprises an annular alignment notch located on the perimeter of the substrate.

10. The apparatus as set forth in claim 7 wherein the camera comprises a solid state CCD camera.

11. The apparatus as set forth in claim 7 wherein the process module comprises a semiconductor process module and the substrate comprises a semiconductor wafer.

12. The apparatus as set forth in claim 7 wherein the manipulator comprises a cluster tool robot arm mounted within a handling module, and wherein the process module is located adjacent the handling module.

13. The apparatus as set forth in claim 12 further comprising a another process module for processing substrates, located adjacent the handling module.

14. The apparatus as set forth in claim 12 wherein the manipulator comprises an entrance load lock arm mounted in an entrance load lock located at an entrance to the process module.

15. The apparatus as set forth in claim 7 wherein the reference point includes a centroid of the substrate.

16. An apparatus for positioning substrates in a substrate processing facility having a process module with a mounting location, the apparatus comprising:

a robot manipulator including an end effector for engaging and moving substrates to the mounting location along a programmed path from a source location to the mounting location remote from the source location, the end effector further including a rotating surface mounted thereon that rotates substrates thereon to a desired rotational orientation;

a camera unit located with a field of view in line with the programmed path, the field of view being arranged to acquire an image of substantially the entire area of the substrate while the substrate is engaged by the end effector and the end effector is located at a known location;

an image processor, interconnected with the camera unit, that determines, based upon the image, the location of a centroid of the substrate and a location of a perimeter interruption on the substrate; and a controller that adjusts the programmed path based upon a translation from the known location to an adjusted location in view of a location of the centroid, while the substrate is positioned on the end effector, based upon a difference between the location of the centroid at the predetermined time and a desired location of the centroid at the predetermined time and that further rotates the rotating surface to position the interruption at a desired rotational orientation with respect to the mounting location.

* * * * *